United States Patent
Dhong et al.

(10) Patent No.: US 7,237,163 B2
(45) Date of Patent: Jun. 26, 2007

(54) LEAKAGE CURRENT REDUCTION SYSTEM AND METHOD

(75) Inventors: Sang Hoo Dhong, Austin, TX (US); Hwa-Joon Oh, Austin, TX (US); Silvia Melitta Mueller, Altdorf (DE); Joel Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 10/982,111

(22) Filed: Nov. 5, 2004

(65) Prior Publication Data

US 2006/0101315 A1    May 11, 2006

(51) Int. Cl.
*G01R 31/28*    (2006.01)
(52) U.S. Cl. .................................... 714/726
(58) Field of Classification Search ............ None
See application file for complete search history.

(56) References Cited

U.S. PATENT DOCUMENTS 5,487,074 A * 1/1996 Sullivan ............ 714/727
5,504,756 A * 4/1996 Kim et al. ............ 714/729
6,622,273 B1 * 9/2003 Barnes ............ 714/733
6,671,841 B1 * 12/2003 Golshan ............ 714/729

OTHER PUBLICATIONS

Abdollahai, A. and Fallah, F. and Pedram, M., "Leakage Current Reduction in Sequential Circuits by Modifying Scan Chains", *Proceedings of the 4th International Symposium on Quality Electronic Design* (ISQED'03), 2003, IEEE.

* cited by examiner

*Primary Examiner*—Christine T. Tu
(74) *Attorney, Agent, or Firm*—Carr LLP; D'Ann N. Rifai

(57) ABSTRACT

An apparatus, a method and a computer program are provided to reduce leakage current in a processor. Traditionally, extra logic is employed to reduce leakage currents. However, reducing leakage current without sacrificing fine grain operations and speed can be difficult. Achieving such a goal can be accomplished by incorporating a multiplexer (mux) into the scan-in path of scan registers so that units or sub-units of the processor can be powered down individually. Additionally, the muxes are not incorporated into time paths, so speed can be preserved.

19 Claims, 6 Drawing Sheets

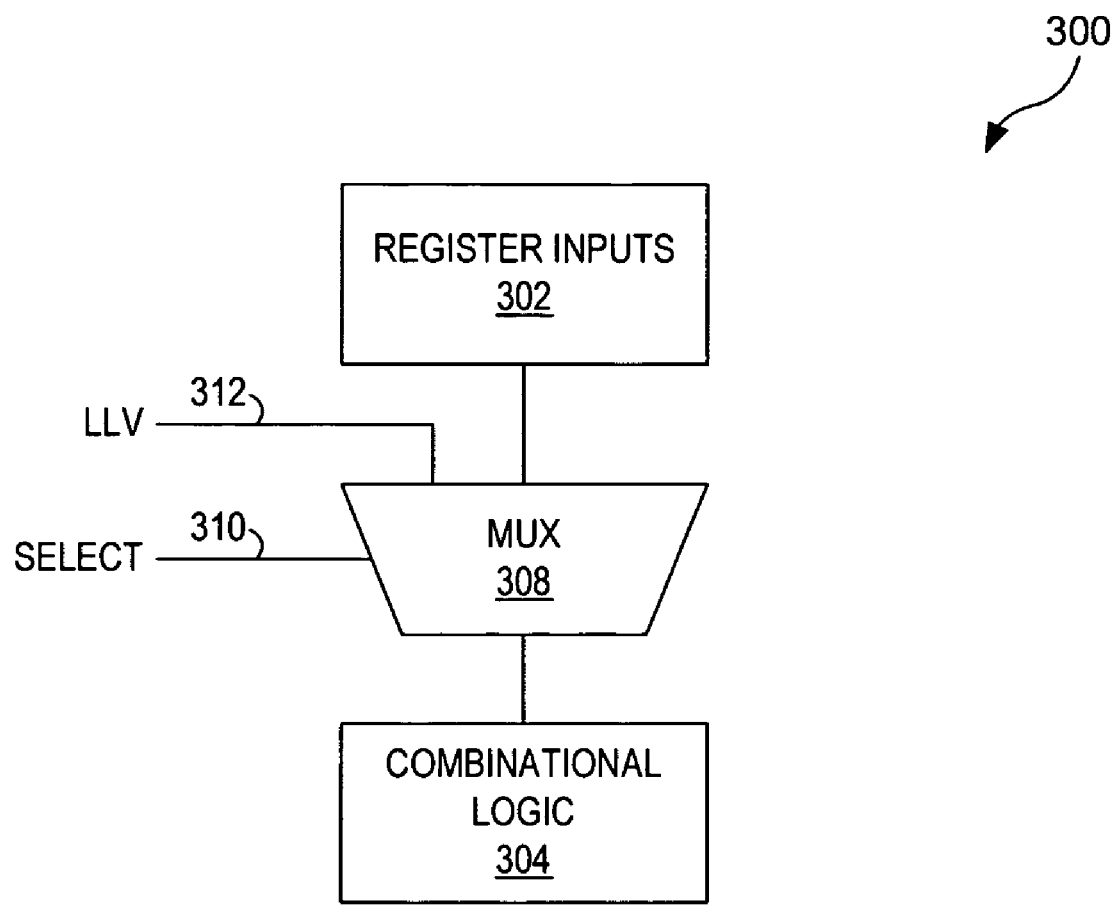
*PRIORART*
*FIG. 3*

LEAKAGE CURRENT REDUCTION SYSTEM AND METHOD

TECHNICAL FIELD

The present invention relates generally to the field of computer devices and, more particularly, to a leakage current reduction system and method.

BACKGROUND OF THE INVENTION

Developments in modern electronic devices have resulted in smaller and smaller circuits and devices in general. As devices become smaller and smaller, particularly with respect to circuit-level components, the leakage current of a given circuit or design has become increasingly important to manage. Moreover, as technology and advancements result in smaller-scale devices, the leakage current, typically an undesirable stray current that flows through an electronic device, which is ordinarily small relative to the operating current and/or voltages of a device, approaches a higher percentage of the total operating currents of the device. Accordingly, as technology drives toward smaller circuits, efforts have also been undertaken to reduce the leakage current to a negligible or otherwise, manageable level. Additionally, developments in device performance have encouraged investigation of various methods and techniques to reduce the power required to operate a device.

For example, clock gating is a common-technique for reducing the power of circuits, or even entire units, during clock cycles in which the circuits or components are not in use. When the clock of a register, for example, is gated or otherwise turned off, the register and its output maintain the previous state. Thus, a switching power in the circuit can be reduced. However, reduction in switching power does not necessarily impact the leakage current of the circuit to a substantial enough degree to reduce problems associated with a relatively high leakage current.

An example of a circuit that has undesirable leakage current is FIG. 1 of the drawings. The reference numeral 100 generally designates conventional logic design that comprises combinational logic 104, register inputs 102, and register outputs 106. With the logic 100, data is input into the combinational logic 104 through the register inputs 102, and resulting data is output from the combinational logic 104 to the register outputs 106. However, the combinational logic 104 utilizes thin film transistors, such as Positive channel Metal Oxide on Silicon (PMOS) transistors; thus, there can be an undesirable leakage current.

Manipulating or otherwise controlling the input data into the register inputs 102 of a circuit 100 can be a useful technique to help reduce a leakage current when the circuits are not actively in use, particularly in very large scale integration (VLSI) circuits. Several techniques have been developed in an effort to maximize the use of an appropriately configured minimum leakage vector. For example, one common technique includes adding multiplexer logic, as depicted below in conjunction with FIG. 3, between the input registers (not shown) and the target combinational logic circuit 104. In particular, the input multiplexer method adds a multiplexer for each output of an input register (not shown), thereby allowing a selection between data, passed to the combinational logic circuit 104 in ordinary operation, and a minimum leakage vector, applied to the combinatorial circuit as required, through an appropriate selection of the multiplexer. However, this method often incurs timing delays to the circuits which might not be acceptable for high-performance designs because the cycle time of system can be increased.

Other techniques employ scan-chain circuitry typically included in many electronic devices in order to facilitate testing and other diagnostic operations. For example, in many systems, latch bits are often linked together to form a scan chain. In particular, many scan-based methods are configured to switch the entire system or scan chain into a scan mode, and apply a minimum leakage vector as a scan entry. However, switching to a scan mode in some systems can require waiting several clock cycles, during which time previously issued commands in a pipeline are completed and cleared.

Referring to FIG. 2 of the drawings, the reference numeral 200 generally designates an n-bit scan register. The register 200 comprises a local clock buffer (LCB) 202 and latch bits 250, 252, and 254. Each latch bit 250, 252, and 254 further comprises one multiplexer (mux) 204, 206, and 208, and one latch 210, 212, and 214. Typically, the register 200 is utilized for n-bits, so that a latch bit, such as the latch bits 250, 252, and 254, is utilized for each bit. FIG. 2, however, only depicts latch bits for the purposes of illustration, but there could be any number of latch bits as desired.

The register 200 is initiated by a clocking signal. The clocking signal is received at the LCB 202 through the communication channel 234. However, for the LCB 202 to generate a local clock signal, which is communicated to each latch 210, 212, and 214 through the communication channel 229, the LCB 202 also should receive an activation signal and a select signal (SL) through the communication channels 236 and 232, respectively. The SL signal indicates the mode of operation of the register 200, where a '1' indicates scan mode and a '0' indicates normal mode.

Depending on the mode of operation, the register 200 operates as normally latching data or as scanning data for testing purposes. In addition to providing the SL signal to the LCB 202, the SL signal is provided to each mux 204, 206, and 208 through the communication channel 232. In normal mode (SL=0), data is input into each muxes 204, 206, and 208 through the communication channels 218, 220, and 222, respectively. When properly clocked, the data can be latched into each of the latches 210, 212, and 214. Then, the latched data can be output from the latches 210, 212, and 214 through the communication channels 224, 226, and 230, respectively.

In scanning mode (SL=1), the operation of the register 200 is substantially different. Scan-in data is input into the mux 204 through the communication channel 216. The scan-in data is then latched in the latch 210, when enabled by the local clocking signal provided by the LCB 202. The latch 210 can then output the latched scan-in data through the communication channel 224, which is also input into the mux 206. The mux 206 can then latch the scan-in data in the latch 212, when clocked. The process then successively continues through the latch bits 250, 252, and 254 until the mux 208 receives the scan-in data. The mux 208 can then latch the scan-in data in the latch 214, where the latch 214 can output scan-out data through the communication channel 230.

The scan function (SL=1) can be used for applying the Low Leakage Vector (LLV) with small hardware overhead without having an adverse on the timing of combinational logic, such as the combinational logic 104, coupled to the register 200. When scanning in the LLV, the data is shifted through the latches 210, 212, and 214 one bit at a time. However, the chain can be very long, exceeding 1000 bits.

Therefore, many cycles are required to scan in all of the data. Additionally, the power used for switching can outweigh the power saved due to the reduced leakage current once the LLV is applied.

When scanning, the process of scanning always updates the entire chain which usually consists of several registers, such as the register 200. Therefore, applying the LLV as result of a scan operation requires that all registers of that scan chain are updated. In cases where the entire system can be transitioned in a "low-leakage" state, the scan method can be useful. However, in other cases, such as cases for powering down infrequently used subunits while the remainder of the system is functioning, the scan method is not as effective.

Another solution is to utilize intermediate multiplexers. Referring to FIG. 3 of the drawings, the reference numeral 300 generally designates a multiplexed logic system. The system 300 comprises register inputs 302, a mux 308, and combinational logic 304. There can be a number of register inputs and muxes; however, for the purposes of illustration, only one mux and one register input are shown.

Essentially, intermediate muxes, such as the mux 308, are interposed between the register inputs 302 and the combinational logic 304. The mux 308 then can control the function of the system 300. Based on the select signal input through the communication channel 310 to the mux 308, allow for selection between normal mode (select=0) and low-leakage mode (select=1). In normal mode (select=0), data is passed through the mux 308 from the register inputs 302 to the combinational logic 304. However, in low-leakage mode 2(select=1), LLV data is input into mux 308 through the communication channel 312, which is then passed onto the combinational logic 304.

In the system 300, LLV is constant, allowing the muxes, such as the mux 308, to be simplified to other logical structures, such as AND gate or OR gates. However, logic is clearly added to the input paths of the combinational logic 304. The additional logic, therefore, adds delay to the timing critical paths of the combinational logic 304.

Therefore, there is a need for a system and/or method for reducing leakage currents that addresses at least some of the problems and disadvantages associated with conventional systems and methods.

SUMMARY OF THE INVENTION

The present invention provides an apparatus for reducing leakage current. At least one register is employed that utilize at least one latch. The latch utilizes a data path and a scan path, wherein the scan path is at least configured to receive indicia of a Low Leakage Vector (LLV). Additionally, the LLV can at least be introduced by an instruction.

BRIEF DESCRIPTION OF THE DRAWINGS

For a more complete understanding of the present invention and the advantages thereof, reference is now made to the following descriptions taken in conjunction with the accompanying drawings, in which:

FIG. 3 is a block diagram depicting a multiplexed logic system that utilizes the input mux method;

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 1:
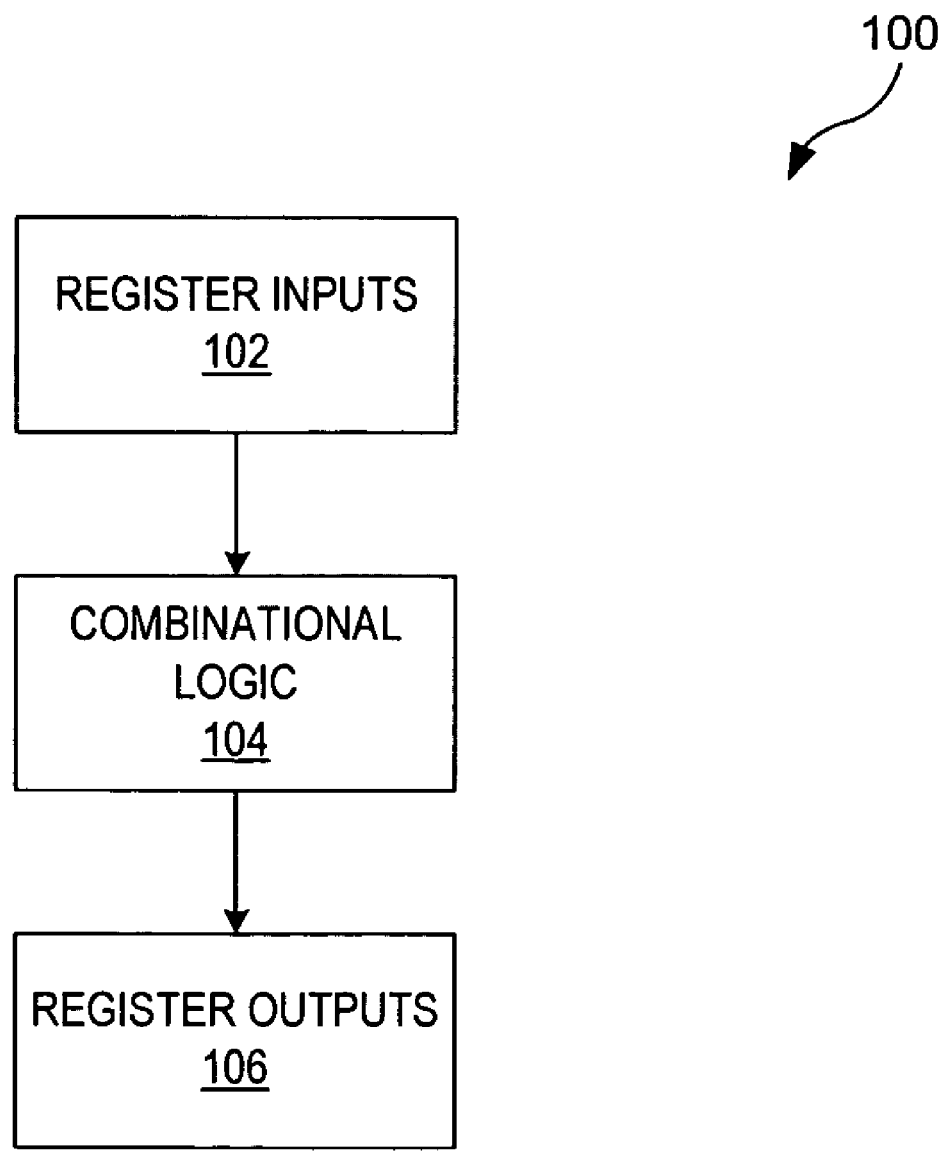
FIG. 1 is a block diagram depicting a conventional combinational logic circuit.
Figure 2:
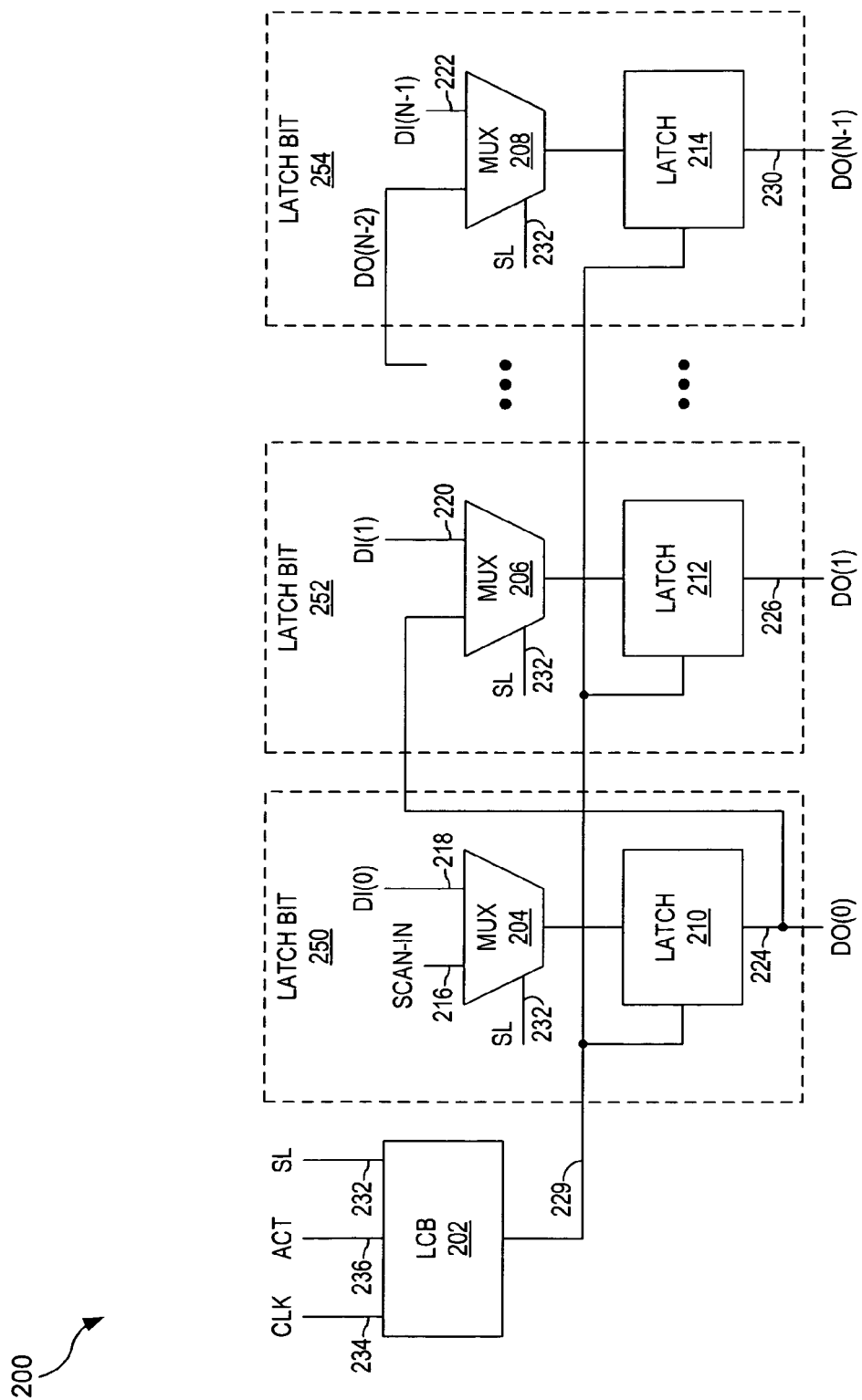
FIG. 2 is a block diagram depicting a simple n-bit scan register.
Figure 4:
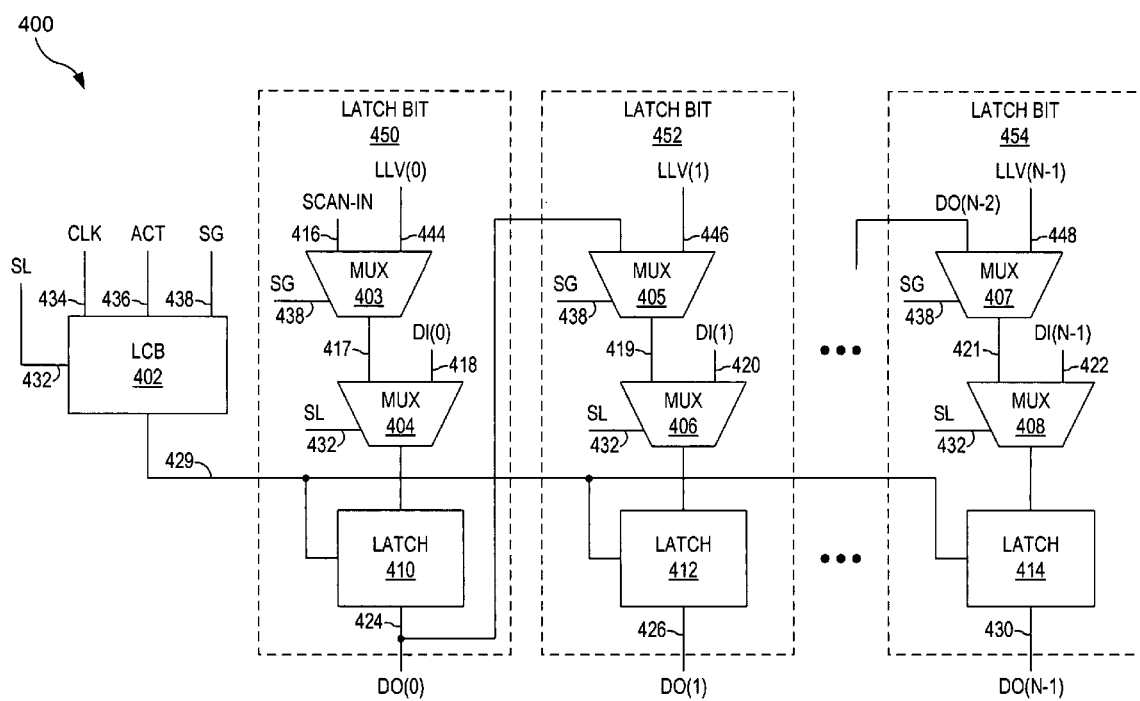
FIG. 4 is a block diagram depicting an enhanced n-bit scan register.
Figure 5:
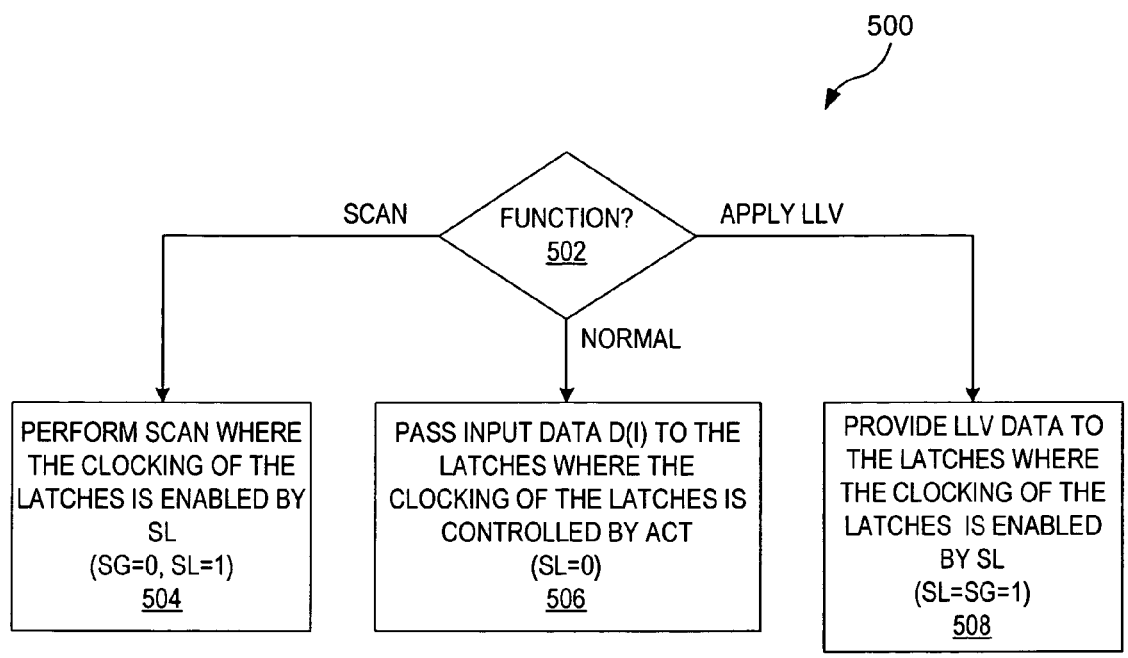
FIG. 5 is a flow chart depicting the operation of the enhanced n-bit scan register.

Referring to FIGS. 4 and 5 of the drawings, the reference numerals 400 and 500 generally designate an n-bit scan register with a read port for a Low Leakage Vector (LLV) and its method of operation. The register 400 comprises an LCB 402 and enhanced latch bits 450, 452, and 454. Each latch bit 450, 452, and 454 further comprises two cascaded muxes 403, 404, 405, 406, 407, and 408, and one latch 410, 412, and 414. Typically, the register 400 is utilized for n-bits, so that a latch bit, such as the enhanced latch bits 450, 452, and 454, is utilized for each bit. FIG. 4, however, only depicts latch bits for the purposes of illustration, but there could be any number of latch bits as desired.

The register 400 is initiated by a clocking signal. The clocking signal is received at the LCB 402 through the communication channel 434. However, for the LCB 402 to generate a local clock signal, which is communicated to each latch 410, 412, and 414 through the communication channel 429, the LCB 402 also should receive an activation signal and two select signals (SL and SG) through the communication channels 436, 432, and 438, respectively. For the purposes of illustration, a signal communication channel is also used for each control signal; however, there can, and typically are, multiple communication channels for each control signal.

The control signal inputs can then indicate the mode of operation of the register 400. There are three different functions of the register 400, selected in step 502: normal, scan, and LLV. For the normal function, SL is '0,' and SG is irrelevant. For the scan function, SG is '0,' while SL is '1.' Then, for the LLV function, SG and SL are both '1.'

Under the normal function (SL=0) of step 506, the register 400 operates as normally latching data. In addition to providing the SL signal to the LCB 402, the SL signal is provided to each mux 404, 406, and 408 through the communication channel 432. Data is input into each muxes 404, 406, and 408 through the communication channels 418, 420, and 422, respectively. When properly clocked, the data can be latched into each of the latches 410, 412, and 414. Then, the latched data can be output from the latches 410, 412, and 414 through the communication channels 424, 426, and 430, respectively. In this mode, the clocking of the latches are controlled by the activate signal provided to the LCB 402 through the communication channel 436.

Under the scan function (SL=1 and SG=0) of step 504, the operation of the register 400 is substantially different. Scan-in data is input into the mux 403 through the communication channel 416 and passed through communication channel 417 to the mux 404. The scan-in data is then latched in the latch 410, when enabled by the local clocking signal provided by the LCB 402. The latch 410 can then output the latched scan-in data through the communication channel 424, which is also input into the mux 405. The mux 405 passes the data to the mux 406 through communication channel 419, and then, mux 406 can then latch the scan-in data in the latch 412, when clocked. The process then successively continues through the chain of enhanced latch bits 450, 452, and 454 until the mux 407 receives the scan-in data. The mux 407 passed the scan-in data to the mux 408 through the communication channel 421, and then mux 408 can then latch the scan-in data in the latch 414, where the latch 414 can output scan-out data through the communication channel 430. In this mode, the clocking of the latches is enabled by the SL signal provided through the communication channel 432.

Figures 6, 7:
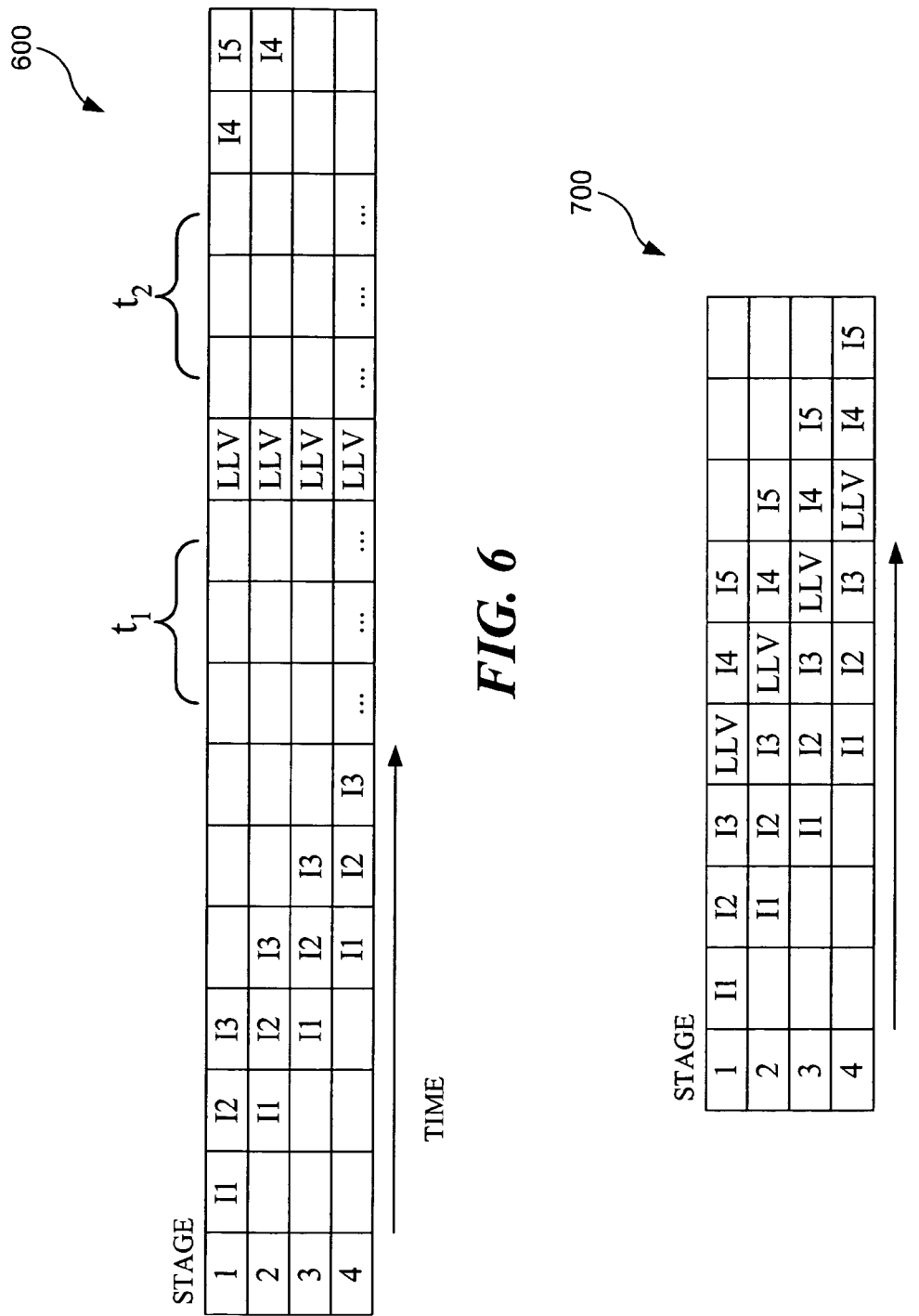
FIG. 6 is a diagram depicting an example operation of a 4 stage pipeline in a scan mode.
FIG. 7 is a diagram depicting an example operation of a 4 stage pipeline in a normal mode.

Finally, under the LLV function (SL=1 and SG=1) of step 508, the LLV can be applied. Accordingly, the LLV is applied as a special scan operation or by a power save instruction as depicted in FIGS. 6 and 7, respectively. Components of LLV are input into the muxes 403, 405, and 407 through the communication channels 444, 446, and 448, respectively. It should also be noted that there is an LLV component for each latch bit. Each mux 403, 405, and 407 passes its LLV component to the muxes 404, 406, and 408 through the communication channels 417, 419, and 421, respectively. Then each mux 404, 406, and 408 can latch its LLV component into the latches 410, 412, and 414, where the LLV components can be output through communications channels 424, 426, and 430. As in the scan mode, the clocking of the latches is enabled by the SL signal.

The register 400 is depicted with a plurality of muxes 403, 404, 405, 406, 407, and 408. Alternately, however, mux pairs, such as muxes 403 and 404, of the latch bits 450, 452, and 454 can be combined into three-port muxes. However, combining the mux pairs such as muxes 403 and 404, of the latch bits 450, 452, and 454 into three-port muxes will add delay to the data path. Additionally, the muxes 403, 404, 405, 406, 407, and 408 can be replaced with suitable substitutes, such as AND gate and/or OR gates.

However, the LLV can be performed within two different, distinct ways: through scan operations and through a special instruction. Referring to FIG. 6 of the drawings the reference numeral 600 generally designates an example operation of a four-stage pipeline during a scan. During the operation 600, the instructions I1, I2, I3 are entered into the stages of the pipeline. When the circuits connected to a scan chain should be switched into a low-leakage-state, the time period $t_1$ allows the system with all is registers, such as the register 400, to transition into scan mode. The LLV is then applied to all latch bits on a given chain by setting SG=SL=1. The LLV is applied as a result of a special scan function, and in the time period $t_2$, the register transitions back to normal mode, where other instructions I4 and I5 are executed.

Referring to FIG. 7 of the drawings the reference numeral 700 generally designates an example operation of a four-stage pipeline in a normal functional mode wherein the LLV is applied as a result of a power save instruction. During the operation 700, the instructions I1, I2, I3 are entered into the stages of the pipeline. However, the LLV is entered as a simple instruction between instructions I3 and I4.

This power save instruction and register 400, therefore, have several advantages over more conventional systems. In particular, the power save instruction allows for fine grain operation. In other words, units or sub-units within a system can be switched into a low-leakage state while the remainder of the system functions as in step 506. The overhead from switching between normal mode and scan mode is also saved because there is no need to wait for the pipeline to be empty to enter into a power saving state.

Specifically, the power save instruction operates as a normal instruction. The sequencing unit of a processor (not shown) decodes the instruction and, depending on the opcode and a possible immediate operand, the instruction is sent to one or multiple units (allowing for finer granularity). This allows some registers to remain unchanged while other registers power down.

There is also no additional delay to the timing critical data input path associated with the use of the power save instruction. Delays can result on the data input path with other techniques. Specifically, the delays can be increase with the addition of a mux along the data path. However, the use of the additional muxes 403, 405, and 407 that are outside the data path, do not add any delay. As a matter of fact, the addition of the muxes 403, 405, and 407 do not affect the functionality with respect to speed of any paths because the scan-in typically operates at a lower frequency than the functional path and because the LLV is constant.

Moreover, in any processor, there are registers that hold an architectured state, such as status and control registers. If an LLV is forced on registers holding an architectured state, then essential data may be lost. Typically, with scanning methods, shadow registers are employed when applying an LLV. Hence, extra registers are utilized in conventional designs. Because units or sub-units or even single registers can be selected for applying an LLV, the overhead associated with registers holding an architectured state is eliminated. Registers holding an architectured can be left unchanged by the power save instruction.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

What is claimed is:

1. A system, comprising:
   a plurality of latches;
   a plurality of first multiplexers (muxes) coupled to the plurality of latches;
   wherein each latch of the plurality of latches is uniquely coupled to a corresponding first mux;
   wherein each first mux is configured to receive a first select signal, a data input, and a first scan input, and to transmit to the corresponding latch either the data input or the first scan input based on the first select signal;
   a plurality of second muxes coupled to the plurality of first muxes;
   wherein each second mux is uniquely coupled to a corresponding first mux;
   wherein each second mux is configured to receive a second select signal, a second scan input, and a low leakage vector (LLV) input, and to transmit to the corresponding first mux either the second scan input or the LLV input based on the second select signal; and
   wherein the LLV input is configured to reduce a leakage current associated with the plurality of latches.

2. The system of claim 1, wherein the plurality of latches is configured as a scan chain.

3. The system of claim 2, wherein the plurality of latches are configured such that the output of each latch from 0 to (n−2) of n latches is configured as the second scan input of the second mux associated with the next latch in the scan chain.

4. The system of claim 1, wherein the system is configured to apply the LLV input to the plurality of latches in a single clock cycle.

5. The system of claim 4, further comprising a local clock buffer (LCB) coupled to each of the plurality of latches, each of the plurality of first muxes, and each of the plurality of second muxes, the LCB configured to:
   receive a scan select instruction, to generate the first select signal based on the received scan select instruction, and to transmit the first select signal to each of the plurality of first muxes;
   receive a scan gate instruction, to generate the second select signal based on the received scan gate instruction, and to transmit the second select signal to each of the plurality of second muxes; and
   receive a clock signal, and to transmit the received clock signal to each of the plurality of latches.

6. The system of claim 1, wherein the LLV input is received as an instruction.

7. The system of claim 6, wherein the instruction comprises an opcode and data, wherein the opcode is configured to set the first select signal and the second select signal, and the data is configured as LLV data.

8. A method for reducing leakage current, comprising:
   receiving an instruction comprising an opcode and data;
   determining, based on the opcode, whether the instruction is a low-leakage instruction;
   upon a determination that the instruction is a low-leakage instruction, setting a scan enable signal and a scan gate signal to apply the data as a low-leakage vector to a plurality of latches;
   wherein the scan enable signal is a first select signal, for a plurality of first multiplexers coupled to the plurality of latches; and
   wherein the scan gate signal is a second select signal, for a plurality of second multiplexers coupled to the plurality of first multiplexers.

9. The method of claim 8, further comprising applying the data as a low-leakage vector in a single clock cycle.

10. A method for reducing leakage current, comprising:
    determining a selected mode of operation for a plurality of latches out of a plurality of modes of operation;
    the plurality of modes of operation comprising a scan mode, a low-leakage mode, and a data mode;
    setting a scan enable signal based on whether the selected mode of operation is the data mode; and
    setting a scan gate signal based on whether the selected mode of operation is the low-leakage mode.

11. The method of claim 10, wherein the scan enable signal is a select signal for a first plurality of multiplexers coupled to the plurality of latches.

12. The method of claim 11, wherein the scan gate signal is a select signal for a second plurality of multiplexers coupled to the first plurality of multiplexers.

13. The method of claim 10, wherein setting the scan enable signal comprises activating a scan path for the plurality of latches.

14. The method of claim 10, wherein setting the scan gate signal comprises applying a low-leakage vector to scan inputs of the plurality of latches.

15. A processor for reducing leakage current, the processor including a computer-readable medium with executable computer program code embodied thereon, the computer program code comprising:
    computer program code for determining a selected mode of operation for a plurality of latches out of a plurality of modes of operation;
    the plurality of modes of operation comprising a scan mode, a low-leakage mode, and a data mode;
    computer program code for setting a scan enable signal based on whether the selected mode of operation is the data mode; and
    computer program code for setting a scan gate signal based on whether the selected mode of operation is the low-leakage mode.

16. The processor of claim 15, wherein the scan enable signal is a select signal for a first plurality of multiplexers coupled to the plurality of latches.

17. The processor of claim 16, wherein the scan gate signal is a select signal for a second plurality of multiplexers coupled to the first plurality of multiplexers.

18. The processor of claim 15, wherein setting the scan enable signal comprises activating a scan path for the plurality of latches.

19. The processor of claim 15, wherein setting the scan gate signal comprises applying a low-leakage vector to scan inputs of the plurality of latches.

* * * * *